United States Patent [19]

Pearson et al.

[11] 4,392,894
[45] Jul. 12, 1983

[54] SUPERALLOY PROPERTIES THROUGH STRESS MODIFIED GAMMA PRIME MORPHOLOGY

[75] Inventors: David D. Pearson, West Hartford; Frank D. Lemkey, Glastonbury; Bernard H. Kear, Madison, all of Conn.

[73] Assignee: United Technologies Corporation, Hartford, Conn.

[21] Appl. No.: 190,137

[22] Filed: Sep. 24, 1980

Related U.S. Application Data

[63] Continuation-in-part of Ser. No. 177,047, Aug. 11, 1980, Pat. No. 4,328,045, which is a continuation-in-part of Ser. No. 973,193, Dec. 26, 1978, abandoned, which is a continuation-in-part of Ser. No. 913,131, Jun. 6, 1978, abandoned.

[51] Int. Cl.³ .............................................. C22F 1/10
[52] U.S. Cl. ............................... 148/2; 148/11.5 N; 148/12.7 N; 148/162; 148/410
[58] Field of Search .................... 148/11.5 N, 12.7 N, 148/32.5, 131, 162

[56] References Cited

U.S. PATENT DOCUMENTS

| | | | |
|---|---|---|---|
| 3,617,397 | 11/1971 | Maxwell | 148/32.5 |
| 3,642,543 | 2/1976 | Owczarski et al. | 148/162 |
| 3,975,219 | 8/1976 | Allen et al. | 148/11.5 N |
| 4,111,723 | 9/1978 | Lemkey | 148/32.5 |
| 4,116,723 | 9/1978 | Gell et al. | 148/162 |
| 4,161,412 | 7/1979 | Henry | 148/162 |
| 4,209,348 | 6/1980 | Duhl et al. | 148/32.5 |

FOREIGN PATENT DOCUMENTS

490249  2/1953  Canada ................................ 148/162

OTHER PUBLICATIONS

Tien et al., "The Effect of Uniaxial Stress on the Periodic Morphology of Coherent Gamma Prime Precipitates in Nickel-Base Superalloy Crystals", Metallurgical Transactions, vol. 2, Jan. 1971, pp. 215-219.
Tien et al., "The Effect of Orientation and Sense of Applied Uniaxial Stress on the Morphology of Coherent Gamma Prime Precipitates in Stress Annealed Nickel-Base Superalloy Crystals", Metallurgical Transactions, vol. 2, Feb. 1971, pp. 543-553.
Tien et al., "Effects of Stress Coarsening on Coherent Particle Strengthening", Metallurgical Transactions, vol. 3, Aug. 1972, pp. 2157-2162.
Pineau, "Influence of Uniaxial Stress on the Morphology of Coherent Precipitates During Coarsening-Elastic Energy Considerations", Acta Metallurgica, vol. 24, pp. 559-564.
Sims et al., The Superalloys, "Fundamentals of Strengthening", John Wiley & Sons, New York, 1972, pp. 79-103.

Primary Examiner—Peter K. Skiff
Attorney, Agent, or Firm—Charles E. Sohl

[57] ABSTRACT

A high strength nickel base superalloy having a novel microstructure is described. The article consists of a gamma matrix containing a oriented gamma prime second phase having a plate or rod form. This noncuboidal gamma prime phase is produced by aging solution treated material under an applied stress. When this process is applied to a certain class of superalloys which are rich in refractory elements, the resultant structure provides exceptional resistance to creep at elevated temperatures.

13 Claims, 5 Drawing Figures

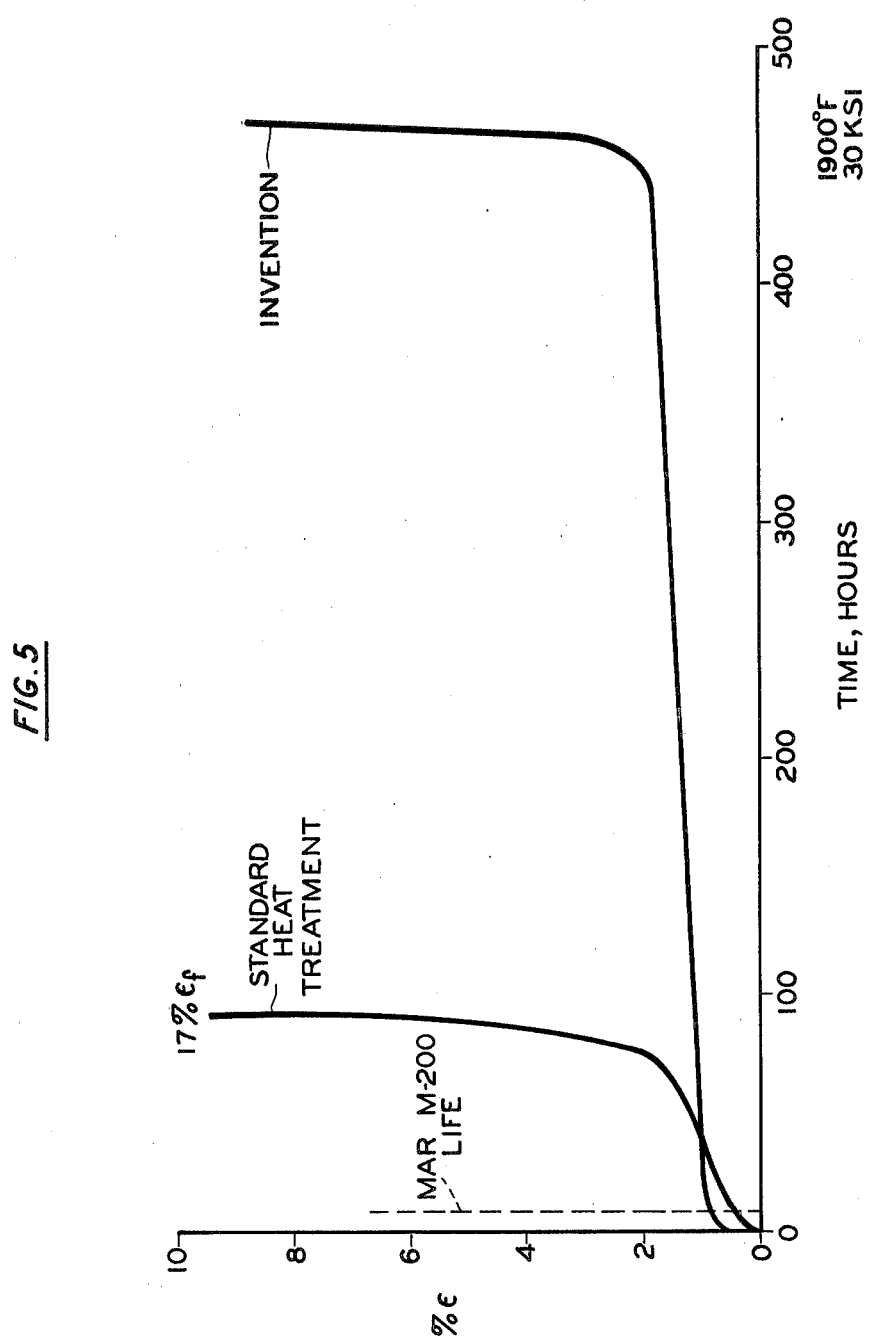

SUPERALLOY PROPERTIES THROUGH STRESS MODIFIED GAMMA PRIME MORPHOLOGY

CROSS REFERENCE TO RELATED APPLICATIONS

This application is a continuation-in-part of application U.S. Ser. No. 177,047 filed Aug. 11, 1980 now U.S. Pat. No. 4,328,045, which is a continuation-in-part of application U.S. Ser. No. 973,193 filed Dec. 26, 1978 now abandoned which in turn is a continuation-in-part of application U.S. Ser. No. 913,131 filed June 6, 1978 now abandoned.

DESCRIPTION

1. Technical Field

The present invention relates to the production of high strength nickel base superalloy articles through the application of stress during aging of solution treated material.

2. Background Art

It has been previously known that the application of stress to an alloy which forms precipitate particles can modify the morphology of the particles. This is described in the following articles.

1. "The Effect Of Uniaxial Stress On The Periodic Morphology Of Coherent Gamma Prime Precipitates In Nickel-Base Superalloy Crystals," *Metallurgical Transactions*, Vol. 2, January 1971, pgs. 215 to 217.
2. "The Effect of Orientation And Sense Of Applied Uniaxial Stress On The Morphology Of Coherent Gamma Prime Precipitates In Stress Annealed Nickel-Base Superalloy Crystals," *Metallurgical Transactions*, Vol. 2, February 1971, pgs. 543 to 553.
3. "Effects Of Stress Coarsening On Coherent Particle Strengthening," *Metallurgical Transactions*, Vol. 3, August 1972, pgs. 2157 to 2162.
4. "Influence Of Uniaxial Stress On The Morphology Of Coherent Precipitates During Coarsening—Elastic Energy Considerations," *Acta Metallurgica*, Vol. 24, 1976, pgs. 559–564.

These articles deal with the effect of stress on the morphology of precipitate particles but there is no discussion in these articles of the effect of the resultant structure on elevated temperature creep properties.

DISCLOSURE OF INVENTION

The present invention relates to a process which can be applied to a class of nickel base superalloys in single crystal form, to provide unique microstructures and exceptional properties at elevated temperatures. A class of alloys is described in which the gamma prime phase is saturated with an element selected from the group consisting of tantalum, columbium, vanadium and mixtures thereof and in which the gamma matrix phase is saturated with an element selected from the group consisting of tungsten, chromium, molybdenum and rhenium.

The alloy is formulated so that the gamma prime phase lattice parameter is smaller than the gamma phase lattice parameter (a negative misfit). The alloy is also formulated so that it contains from 30 to 75 volume percent of the gamma prime phase. The alloy is then directionally cast, as a single crystal, and homogenized by appropriate heat treatment where the gamma prime phase is solutionized.

The solutionized material is then quenched to room temperature at a rate sufficient to suppress significant growth of the gamma prime phase and aged with a stress applied. When the applied stress is in the <100> direction, and the articles thus treated will have exceptional properties in the <100> direction. The effect of these combinations of steps is to produce an oriented noncuboidal gamma prime phase with the gamma prime being preferably present in the form of continuous platelets whose major dimensions are transverse to the applied stress axis.

The present invention relates to superalloy articles having remarkable properties at elevated temperatures. Two broad aspects are important, the specific alloy composition and the unique heat treatment.

The alloy must meet certain criteria which are in some respect contrary to the teachings of the prior art. In particular, it is desired so that both the gamma prime phase and the gamma phase be saturated with refractory elements. As used herein, the term "refractory elements" includes the elements tantalum, columbium, vanadium, tungsten, chromium, molybdenum and rhenium.

The elements tantalum, columbium and vanadium partition or segregate to the gamma prime phase while the elements tungsten, chromium, molybdenum and rhenium essentially partition to the gamma phase upon solidification.

For the achievement of optimum properties it is required that both of these phases be saturated with these elements. By "saturated" we mean that the elements are present in an amount great enough to just cause the formation of equilibrium phases which are rich in these refractory elements. Such phases are referred to in the superalloy art as Topologically Closed Packed (TCP) phases such as $\alpha$Mo, $\alpha$Cr, $\alpha$W or ta phases. In the prior art, the formation of such phases was avoided since these phases were deemed to be deleterious to the properties of nickel base superalloys, based on the nickel-aluminum binary system or gamma-gamma prime system.

The previously enumerated elements partition either to the gamma phase or the gamma prime phase. Since the elements have different atomic diameters, the additions of various elements and the partitioning of these elements to the various phases will effect the relative lattice parameters of the phases.

In the prior art, there have been definite attempts made to control the alloying additions in a fashion such that the lattice parameters of the gamma and the gamma prime phases are equalized so that there is negligible lattice parameter mismatch between the gamma and gamma prime phases and the gamma matrix. This matching of lattice parameters was believed necessary for long creep lives. Virtually all commercial superalloys contain gamma prime phase with a lattice parameter which is slightly greater than that of the gamma phase.

It is, however, somewhat difficult to accurately assess the mismatch in commercial superalloys because of the variations in measurement techniques and because measurements are usually conducted at room temperature although the effects are really only apparent at elevated temperatures.

It appears, that it is essential for the success of the present invention that the gamma prime phase lattice parameter be at least 0.1% smaller than the gamma lattice parameter when measured at room temperature using X-ray techniques. The relative coefficient of thermal expansion of the phases are such that this negative misfit is probably even larger at elevated temperatures.

The third constraint is that the alloy must contain from about 30 to 75 volume percent of the gamma prime phase and preferably from about 45 to about 65 volume percent of the gamma prime phase.

The fourth constraint refers to the amount of chromium which is present. Chromium in amounts of greater than about 5% appears to lower the properties of the alloy and amounts greater than about 8% are not desired.

The previous restrictions define the class of nickel base superalloys in a somewhat unconventional fashion. However, we believe that these restrictions are essential to the successful practice of the invention, and that the previous description is the best method of describing these alloys. In the subsequent illustrative examples, several representative compositions will be described.

The heat treatment required to achieve the exceptional properties will now be described. As an initial step, the alloy must be solutionized so that it is compositionally homogeneous throughout. Homogeneity is defined as less than 1% variation in refractory content throughout the alloy. This is essential if the desired results are to be achieved. This homogenization will be achieved by annealing at elevated temperatures at or above the gamma prime solvus but below the incipient melting temperature. The high refractory metal content necessitates holding at this temperature for a substantial amount of time to achieve homogenization. Having placed the alloy in an homogeneous condition, it is necessary to cool the alloy at a rapid rate to room temperature for parts with thicknesses of less than about one half inch air cooling is sufficiently rapid. The rapid cooling retards the growth of the gamma prime phase which would occur at a slower cooling rate so that the cooled article contains a high number of very fine gamma prime particles.

The alloy is then aged at a temperature of between about 1200° F. and the gamma prime solvus temperature to cause the controlled growth of the gamma prime phase. Most importantly, the aging step is conducted with a stress applied to the article and the applied stress causes the gamma prime phase to nucleate and grow in the form of fine platelets or optionally rods depending upon the stress conditions. An applied tensile stress produces platelets while on applied compressive stress produces rods. The platelet morphology is believed to be stronger and more stable under use conditions in which tensile stresses will be encountered. The spacing between adjacent gamma prime platelets or lamellae will be less than about 0.5 microns.

The stress required to produce the oriented morphology is not great, it appears that a stress greater than 10% of the yield strength, at the temperatures in questions, will be sufficient. In tensile creep specimens oriented morphologies are observed even in the regions of the samples in the grips where a relatively low stress condition exists.

The time required to produce the oriented morphology will vary with temperature, with a lesser time being required at the higher temperatures.

As an alternative to this stress aging step the article may be placed in service as solution heat treated so that the oriented gamma prime phase is formed in service.

FIG. 1 is a transmission electron micrograph of a Ni-Al-Mo-Ta alloy (described below with reference to FIG. 3) which has been conventionally treated so that it contains the equilibrium cuboidal gamma prime morphology. FIG. 2 is a replica which illustrates the (platelet) gamma prime morphology of the invention. The sample from which FIG. 2 was taken had been aged under stress to produce the platelet morphology.

BRIEF DESCRIPTION OF DRAWINGS

FIG. 5 shows the creep properties of variously heat treated samples tested at 1900° F.

BEST MODE FOR CARRYING OUT THE INVENTION

The advantages of the present invention may be better appreciated through reference to the Figures which are described below. All of the data in the Figures was obtained from an alloy containing Ni-5.8%Al-14.3%Mo-6%Ta (weight pct.).

This alloy meets the criteria previously set forth, namely it is a gamma-gamma prime nickel base superalloy in which both the gamma and gamma prime phases are saturated in refractory elements. Also, the gamma prime phase has a lattice parameter which is about 0.6% smaller than the gamma lattice parameter (measured at room temperature) and the gamma prime phase is present in an amount of about 65 volume percent. The test samples from which the information in the Figures was developed were all cast single crystals (in the 100 orientation) which were homogenized at 2250° F. for 16 hours and then air cooled to room temperature. In this treatment the homogenization and solutionization treatment were combined. Using air cooling on the tensile samples in question provided a sufficiently fast cooling rate to effectively suppress significant growth of the gamma prime phase. In all of the graphs a curve is presented which is referred to as the "Standard Heat Treatment". This heat treatment consists of a four hour heat treatment at 1975° F. followed by a 16 hour treatment at 1600° F. in the absence of applied stress. This standard heat treatment is typical of the treatment which is applied to conventional turbine blades in connection with the coating process which is the last step in the processing sequence. The effect of the standard heat treatment is to cause the gamma prime phase particles to assume the equilibrium cuboidal morphology.

Figure 1:
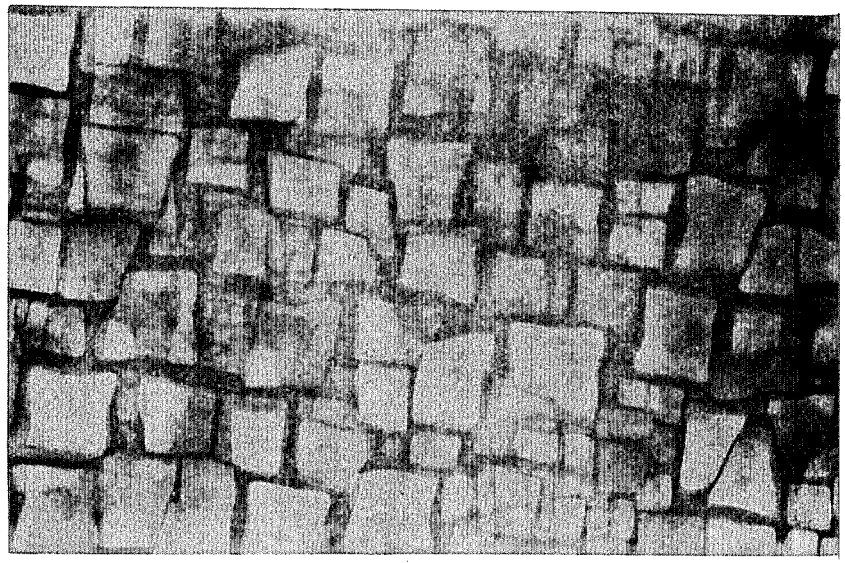
FIG. 1 shows the cuboidal morphology which is typical of prior art heat treated superalloy articles.
Figure 2:
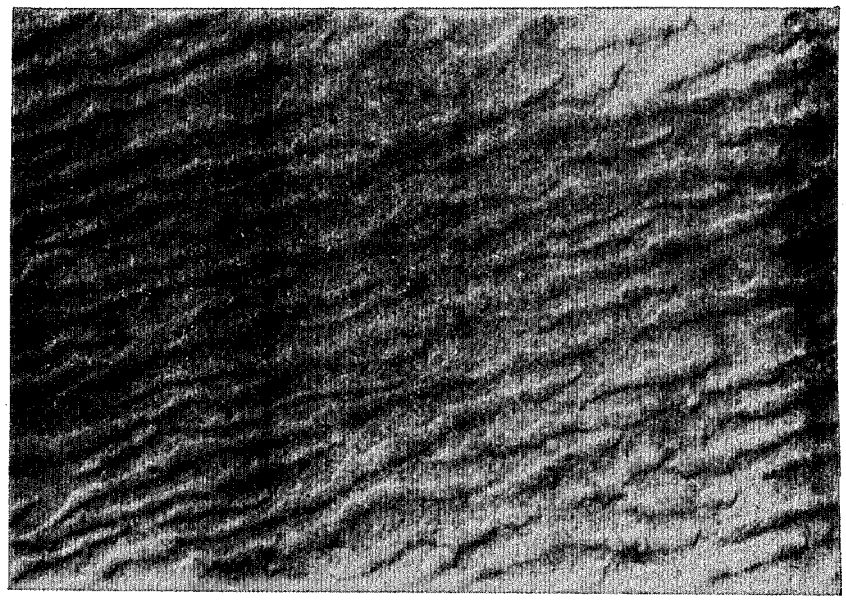
FIG. 2 shows the platelet morphology obtainable with the invention heat treatment.
Figure 3:
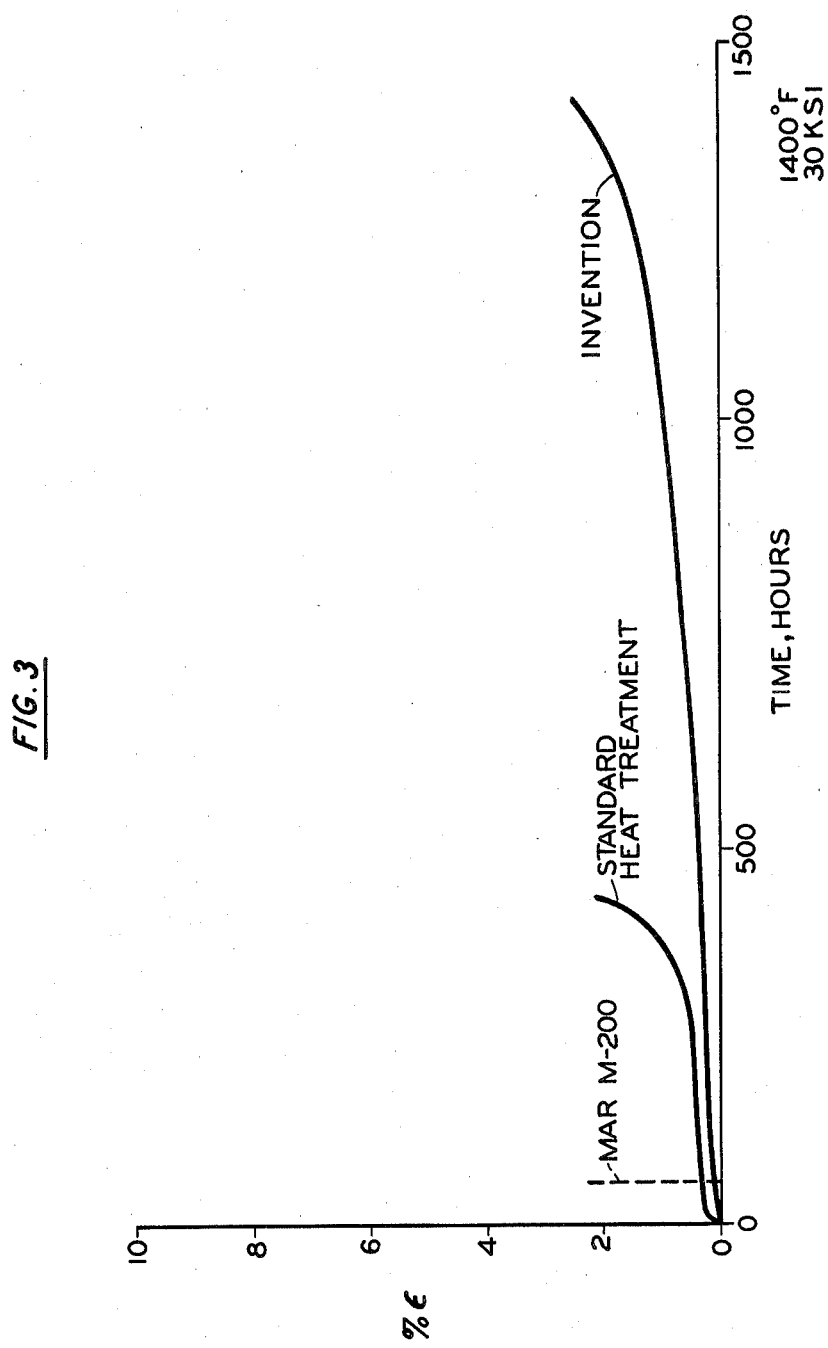
FIG. 3 shows the creep properties of variously heat treated samples tested at 1400° F.

Referring now to FIG. 3, the effect of the invention heat treatment relative to the standard heat treatment can readily be seen. The curve in FIG. 3 labelled "Invention" represents the creep characteristics of the alloy described above which had received only the solution heat treatment prior to being placed in test at a temperature 1400° F. and at an applied stress of 120 ksi. In this test the alloy sample is aged under load while in the test apparatus. The effect of this invention treatment, on the creep properties, relative to the standard heat treatment is apparent. The sample which was given the standard heat treatment shows a stress rupture life of slightly less than 500 hours while the sample treated according to the invention shows a stress rupture life of somewhat more than 1400 hours. Both samples have comparable ductilities, these ductilities are somewhat low as a result of the precipitation of extraneous phases in the alloy under these test conditions. Under these test conditions the invention heat treatment provides an advantage of about 3× in stress rupture life. Also shown in FIG. 3 is a line showing the creep life, under these conditions, of an alloy known as MAR M-200, (Ni-9%Cr-10%Co-12.5%W-1%Cb-2%Ti-5%Al-0.15%C), this is a standard alloy which is used, in directionally solidified form, in a currently produced commercial turbine engine. The advantage of the present invention can readily be seen.

Figure 4:
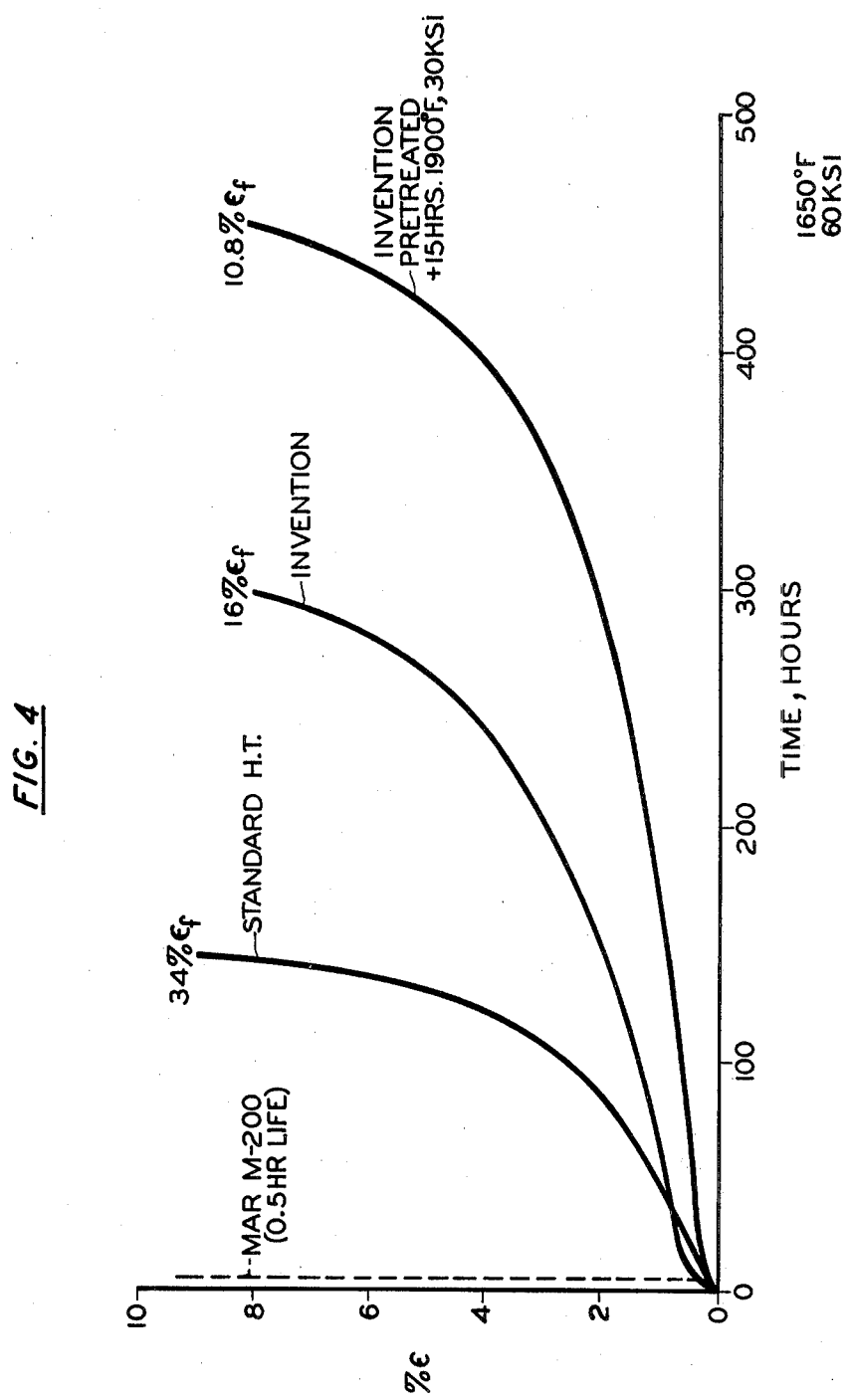
FIG. 4 shows the creep properties of variously heat treated samples tested at 1650° F.

FIG. 4 shows the sample type of data for material tested at 1650° F. and an applied stress of 60 ksi. Three curves are shown; the one labelled "Standard Heat Treatment" shows the behavior of material which was solution treated and then given the standard heat treatment. This material shows a stress rupture life of about 120 hours. The curve labelled "Invention" shows the behavior of material which was solution treated and then air cooled and placed in test, again in this instance the material formed the oriented gamma prime phase during the initial steps of the testing sequence. This sample shows a stress rupture life of about 300 hours. The third curve labelled "Pretreated Invention" shows the behavior of material which was solution treated, air cooled and then treated at 1900° F. and an applied load of 30 ksi for a period of 15 hours prior to being tested at 1650° F. with an applied load of 60 ksi. The effect of the pretreatment at 1900° F. was to form the oriented gamma prime phase prior to testing at 1650° F. The effect can be seen that the pretreating treatment increases the stress rupture life to about 450 hours. Again the creep life of MAR M200 100 single crystals are indicated and the invention articles can be seen to have substantially superior properties.

FIG. 4 shows data developed after testing at 1900° F. with an applied load of 30 ksi. The curve labelled "Standard Heat Treatment" shows the behavior of material after the standard heat treatment and under these test conditions this material has a stress rupture life of about 100 hours. Samples treated according to the invention (placed in test subsequent to air cooling from the solution treatment temperature) shows a substantial life improvement of almost 5×. Once again the creep life of MAR M200 single crystals is seen to be markedly inferior to the life of the invention.

The reasons for the superior mechanical properties obtained in articles of the present invention are complex and not fully understood. The following explanation is based on what is currently known and is believed accurate. However, we do not wish to be bound by this explanation especially with regard to observations and theories that may arise in the future.

In conventional superalloys the microstructure consists of (equiaxed) cuboidal gamma prime particles in a gamma matrix. Deformation occurs by the movement of linear crystalline defects known as dislocations. In conventional superalloys dislocation movement is impeded by the inherent properties by the gamma and gamma prime phases and a further significant resistance to dislocation motion is provided by the interface between gamma and gamma prime phase. When a dislocation moving in the gamma phase (matrix) encounters a gamma prime particle it is often observed that the dislocation bends to avoid passing through the gamma prime particle. In conventional high strength superalloys the gamma prime phase is provided in an amount of about 60% (by volume) and this high concentration of fine particles (<1 micron) provides good mechanical properties.

In the article of the present invention several factors work in concert to provide the observed strength improvements. The inherent resistance to dislocation movement within both the gamma and gamma prime phase is significantly increased by saturating these phases with the refractory elements. The significant mismatch in lattice parameters between the gamma and gamma prime phases substantially increases the resistance of the phase interfaces to the passage of dislocations. Finally, the oriented morphology of the gamma prime phase makes it quite difficult for dislocation to bend and avoid passing through the gamma prime phase. Another important effect is that the refractory elements, particularly the molybdenum retards the growth of the gamma prime phase thus permitting the formation of the oriented morphology while annealing under conditions of applied stress.

Other alloys are tested in an effort to determine the significance of refractory elements on alloy behavior. Two of these alloys contain 8% molybdenum and are substantially inferior to the other two alloys which contain 9% molybdenum. This demonstrates the significant effect of molybdenum on the alloys. Of the two samples containing 8% molybdenum, one sample contained 2% tantalum and 13% aluminum while the other sample contained 4% tantalum and 11% aluminum. The aluminum content was reduced as the tantalum content was increased so as to maintain an approximate consistent fraction of the gamma prime phase. The same effect from different tantalum levels was evident in the two samples containing 9% molybdenum.

The conclusion which can be drawn from this comparison is that while increasing the tantalum increases creep life of the samples, tantalum is not nearly as effective as molybdenum in this regard. For this reason a molybdenum content of at least 5% is preferred.

Another alloy was tested which contained 3.9% cobalt, 2.1% chromium, 2% rhenium, 4.1% vanadium, 2% tantalum and 14.6% aluminum balance nickel. This is a nickel based superalloy saturated in refractory elements which contains about 60% of the gamma prime phase. Because the misfit between the gamma and gamma prime phases is quite low, (less than 0.1%) this alloy demonstrated some degree of stress induced oriented gamma prime morphology but the microstructure was quite coarse and the alloy exhibited very little benefit from the treatment of the present invention. In a similar vein an alloy containing 6% tungsten, 3% tantalum and 12% aluminum balance nickel was tested and again there was no benefit from the process of the present invention; again, this was probably as a result of very low misfit in lattice parameter.

Samples were tested which contained chromium additions as a partial substantial for molybdenum. The chromium was added for purposes of improving the oxidation resistance of the alloy. The results are shown in FIG. 7 for testing conducted at 1900° F. with an applied stress of 25 ksi. The results showed a substantial improvement over the conventional superalloy. However, they are inferior to chromium free alloys.

It should be understood that the invention is not limited to the particular embodiments shown and described herein, but that various changes and modifications may be made without departing from the spirit and scope of this novel concept as defined by the following claims.

I claim:

1. A method for producing a high strength nickel superalloy article of the type having a gamma-gamma prime microstructure including the steps of:
   (a) providing a homogeneous single crystal article of a gamma-gamma prime type alloy in which both the gamma and gamma prime phases are saturated in refractory elements, in which the gamma prime phase has a lattice parameter which is at least 0.1% smaller than the lattice parameter of the gamma phase, and in which (at equilibrium) the gamma prime phase is present in from 30-75 volume percent;
   (b) heating the article to a temperature between the gamma prime solvus and the incipient melting temperature so as to dissolve the gamma prime phase into solid solution;
   (c) cooling the article at a rate sufficient to effectively suppress growth of the gamma prime phase;
   (d) applying a stress along an axis to the article while simultaneously heating it to a temperature at which growth of the gamma prime phase will occur;
   whereby the gamma prime phase grows in an oriented manner and the resultant microstructure is exceptionally resistant to creep along the axis of stress application during aging.

2. A method as in claim 1 wherein step d is performed as a separate step prior to placing the article in its service environment.

3. A method as in claim 1 wherein step d occurs during the initial exposure of the article to its service environment.

4. A method as in claim 1 wherein the axis along which the stress is applied is the <100> direction.

5. A method as in claim 1 in which the stress applied in step d is a tensile stress so that the gamma prime phase assumes a lamellar morphology with the lamellae being oriented substantially perpendicular to the stress axis.

6. A method as in claim 1 in which the stress applied in step d is a compressive stress so that the gamma prime phase assumes a rod like morphology with the major axis of the rods being substantially parallel to the parallel to the stress axis.

7. A nickel base gamma-gamma prime superalloy article adapted to resist stresses at elevated temperatures along a principal axis which comprises:
   a microstructure comprised of a gamma phase matrix containing aligned rods of the gamma prime phase oriented substantially parallel to the principle axis, with the spacing between adjacent gamma prime lamellae being less than about 0.5 micron;
   said gamma and gamma prime phases being substantially saturated with refractory elements, said gamma prime phase having a lattice parameter which is at least 0.1% smaller than the gamma phase lattice parameter, and said gamma prime phase being present in an amount of from 30 to about 75 volume percent.

8. A nickel base gamma-gamma prime superalloy article adapted to resist stresses at elevated temperatures along a principal axis which comprises:
   a microstructure comprised of alternating lamellae of the gamma and gamma prime phases oriented substantially perpendicular to the principal axis, with the spacing between adjacent gamma prime lamellae being less than about 0.5 microns;
   said gamma and gamma prime phases being substantially saturated with refractory elements, said gamma prime phase having a lattice parameter which is at least 0.1% smaller than the gamma phase lattice parameter, and said gamma prime phase being present in an amount of from 30 to about 75 volume percent.

9. An article as in claim 7 or 8 which claims less than 8% chromium.

10. An article as in claim 7 or 8 which contains more than 5% molybdenum.

11. An article as in claim 8 in which the lamellae are oriented substantially perpendicular to the <100> direction.

12. An article as in claim 7 or 8 in which the principal axis is the <100> direction.

13. A method as in claim 1 in which the stress applied in step d is greater than about 10% of the yield strength of the alloy temperature at which the alloy is heated.

* * * * *

UNITED STATES PATENT AND TRADEMARK OFFICE
CERTIFICATE OF CORRECTION

PATENT NO. : 4,392,894
DATED : July 12, 1983
INVENTOR(S) : David D. Pearson, Frank D. Lemkey, Bernard H. Kear It is certified that error appears in the above-identified patent and that said Letters Patent are hereby corrected as shown below:

Column 8, claim 9, line 29   "claims" should read -- contains --

Signed and Sealed this Twentieth Day of December 1983

[SEAL]

Attest:

GERALD J. MOSSINGHOFF

*Attesting Officer*   *Commissioner of Patents and Trademarks*